(12) United States Patent
Kuwabara

(10) Patent No.: US 12,178,014 B2
(45) Date of Patent: Dec. 24, 2024

(54) COOLING DEVICE AND COOLING METHOD

(71) Applicant: TMEIC Corporation, Chuo-ku (JP)

(72) Inventor: Kento Kuwabara, Tokyo (JP)

(73) Assignee: TMEIC Corporation, Chuo-ku (JP)

( * ) Notice: Subject to any disclaimer, the term of this patent is extended or adjusted under 35 U.S.C. 154(b) by 458 days.

(21) Appl. No.: 17/287,586

(22) PCT Filed: Jul. 30, 2019

(86) PCT No.: PCT/JP2019/029792
§ 371 (c)(1),
(2) Date: Apr. 22, 2021

(87) PCT Pub. No.: WO2021/019676
PCT Pub. Date: Feb. 4, 2021

(65) Prior Publication Data
US 2021/0315131 A1     Oct. 7, 2021

(51) Int. Cl.
*H05K 7/20* (2006.01)

(52) U.S. Cl.
CPC ..... *H05K 7/20281* (2013.01); *H05K 7/20263* (2013.01); *H05K 7/20272* (2013.01); *H05K 7/2039* (2013.01)

(58) Field of Classification Search
None
See application file for complete search history.

(56) References Cited

U.S. PATENT DOCUMENTS

| | | | |
|---|---|---|---|
| 8,018,718 B2* | 9/2011 | Goth | F25B 49/02 361/699 |
| 8,514,575 B2* | 8/2013 | Goth | H05K 7/20781 361/698 |
| 11,445,635 B2* | 9/2022 | Gao | H05K 7/20327 |
| 11,729,953 B2* | 8/2023 | Gao | H05K 7/20781 361/699 |

(Continued)

FOREIGN PATENT DOCUMENTS

| | | |
|---|---|---|
| JP | 9-166339 A | 6/1997 |
| JP | 2008-253098 A | 10/2008 |
| JP | 2017-11852 A | 1/2017 |

OTHER PUBLICATIONS

International Search Report issued on Oct. 8, 2019 in PCT/JP2019/029792 filed on Jul. 30, 2019, 1 page.

*Primary Examiner* — Courtney L Smith
(74) *Attorney, Agent, or Firm* — Oblon, McClelland, Maier & Neustadt, L.L.P.

(57) ABSTRACT

A cooling device according to an embodiment includes a first heat exchanger, a first pipe, a second pipe, a bypass pipe, a flow changing mechanism, and a controller. The controller is configured to monitor a detection value related to at least one of a power loss of an electric device and the temperature of a first cooling water, configured to control the flow changing mechanism so that the quantity of a second cooling water flowing from the second pipe into the bypass pipe increases in a case where the detection value is smaller than a first threshold, and configured to control the flow changing mechanism so that the quantity of the second cooling water flowing from the second pipe into the bypass pipe decreases in a case where the detection value is equal to or larger than a second threshold.

9 Claims, 9 Drawing Sheets

(56) References Cited

U.S. PATENT DOCUMENTS

| | | | |
|---|---|---|---|
| 2008/0205003 A1* | 8/2008 | Belady | H05K 7/2079 |
| | | | 361/700 |
| 2011/0056674 A1* | 3/2011 | Campbell | H05K 7/2079 |
| | | | 165/104.31 |
| 2012/0218711 A1* | 8/2012 | Kashirajima | F25B 25/00 |
| | | | 361/700 |
| 2013/0027884 A1 | 1/2013 | Campbell et al. | |
| 2013/0091706 A1* | 4/2013 | Campbell | H05K 7/20627 |
| | | | 29/890.03 |
| 2019/0141861 A1* | 5/2019 | Shedd | F28F 13/02 |

* cited by examiner

COOLING DEVICE AND COOLING METHOD

TECHNICAL FIELD

An embodiment of the present invention relates to a cooling device and a cooling method.

BACKGROUND ART

A water-cooled cooling device that supplies cooling water to a heat sink to which an electric device is thermally connected is known.

CITATION LIST

Patent Literature

[Patent Literature 1] Japanese Unexamined Patent Application, First Publication No. 2017-11852

SUMMARY OF INVENTION

Technical Problem

An object of the present invention is to provide a cooling device and a cooling method capable of improving reliability of an electric device which is a cooling target.

Solution to Problem

A cooling device according to an embodiment includes a first heat exchanger, a first pipe, a second pipe, a bypass pipe, a flow changing mechanism, and a controller. The first heat exchanger is configured to exchange heat between a first cooling water and a second cooling water. The first pipe circulates the first cooling water between the first heat exchanger and a heat sink to which an electric device is thermally connected. The second pipe circulates the second cooling water between the second heat exchanger and the first heat exchanger. The bypass pipe branches from the second pipe so that at least a part of the second cooling water flowing through the second pipe returns to the second pipe without passing through the first heat exchanger. The flow changing mechanism is configured to change a quantity of the second cooling water flowing from the second pipe into the bypass pipe. The controller is configured to monitor a detection value related to at least one of a power loss of the electric device and a temperature of the first cooling water, configured to control the flow changing mechanism so that the quantity of the second cooling water flowing from the second pipe into the bypass pipe increases in a case where the detection value is smaller than a first threshold, and configured to control the flow changing mechanism so that the quantity of the second cooling water flowing from the second pipe into the bypass pipe decreases in a case where the detection value is equal to or larger than a second threshold.

DESCRIPTION OF EMBODIMENTS

Figure 1:
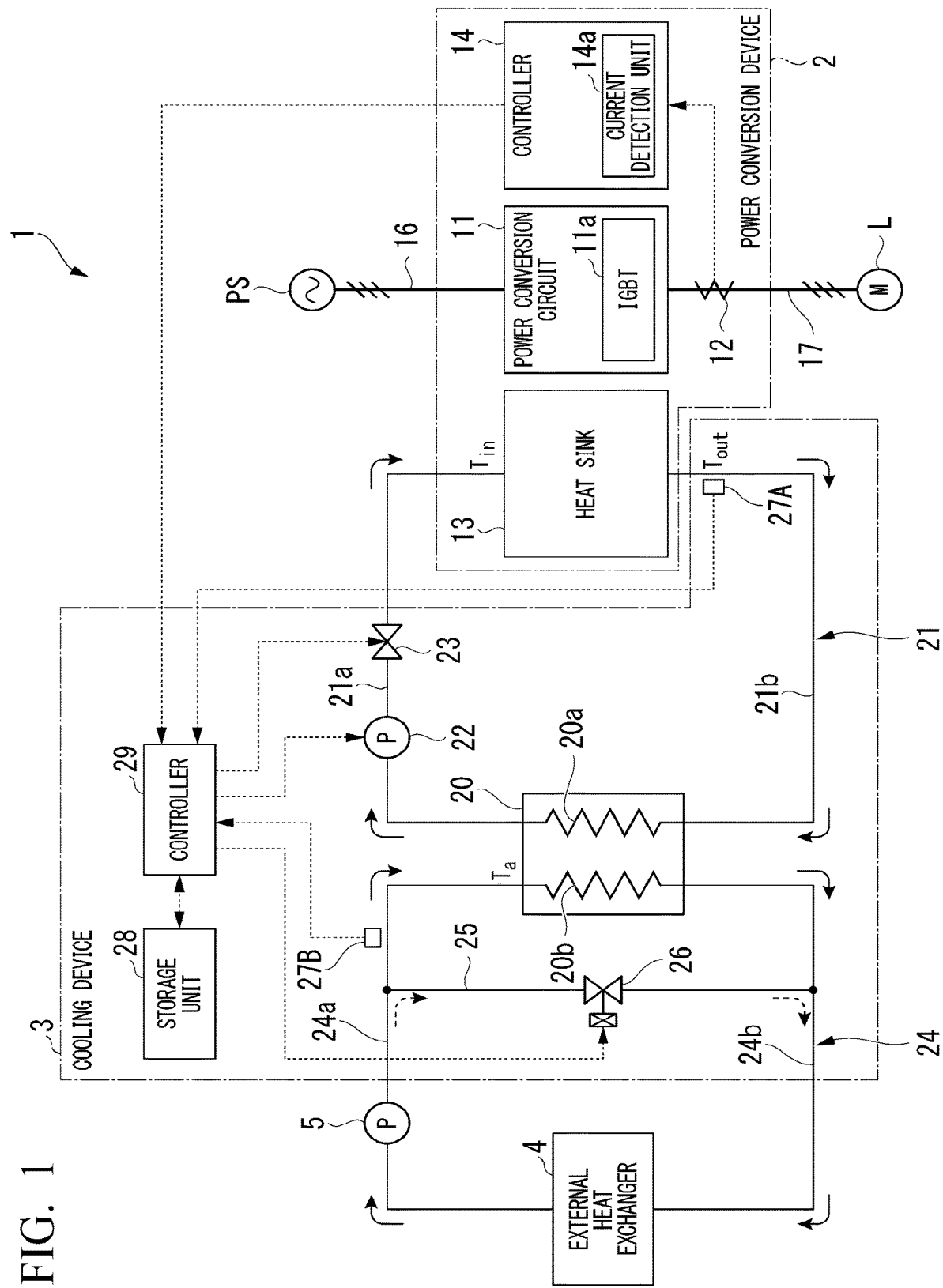
FIG. 1 is a diagram illustrating an example of a drive system according to a first embodiment.

Hereinafter, a cooling device and a cooling method according to an embodiment will be described with reference to the drawings. In the following description, components having the same or similar functions will be denoted by the same reference numerals. Redundant description of these components may be sometimes omitted.

The expression "on the basis of XX" mentioned in the present specification means "on the basis of at least XX", and includes a case where it is on the basis of another element in addition to XX. Furthermore, the expression "on the basis of XX" is not limited to a case where XX is directly used, and also includes a case where it is on the basis of something obtained by performing an operation or a process on XX. "XX" is an arbitrary element (for example, arbitrary information). The expression "middle of YY" mentioned in the present specification means an arbitrary position between both ends of YY without being limited to a midpoint between both ends of YY.

First Embodiment

A cooling device 3 according to a first embodiment will be described with reference to FIGS. 1 to 7. The present embodiment is an example in which the cooling device 3 is applied to a drive system (a motor control system) 1. However, the cooling device 3 can be broadly used in systems other than the drive system. That is, an "electric device" to be described later is not limited to a module of a power conversion device 2 and broadly corresponds to various electric devices in which cooling is desirable.

<1. Overall Configuration of Drive System>

FIG. 1 is a diagram illustrating an example of a drive system 1 including the cooling device 3. For example, the drive system 1 includes a power conversion device 2, a cooling device 3, an external heat exchanger 4, and an external pump 5.

<2. Configuration of Power Conversion Device>

First, the power conversion device 2 will be described. For example, the power conversion device 2 includes a power conversion circuit 11, a current transformer (CT) 12, a heat sink 13, and a controller 14.

For example, the power conversion circuit 11 is connected to an AC power source PS via a first power line 16 and is connected to a load L (for example, a motor) via a second power line 17. The power conversion circuit 11 includes a plurality of switching elements and a plurality of diodes and converts power between AC power and DC power. For example, the power conversion circuit 11 converts AC power supplied from the AC power source PS to DC power, converts the converted DC power to AC power appropriate for the load L, and supplies the AC power to the load L.

The current transformer 12 is provided in the second power line 17. The current transformer 12 generates a detection current proportional to an output current output from the power conversion device 2 to the second power line 17. The current transformer 12 outputs the generated detection current to the controller 14. The current transformer 12 may be provided in the power conversion circuit 11 instead of the second power line 17.

One or more modules 11a (for example, IGBT (Insulated Gate Bipolar Transistor) modules including the switching element) forming the power conversion circuit 11 are attached to the heat sink 13, and the heat sink 13 is thermally connected to the modules 11a. One or more passages through which a first cooling water to be described later flows are formed inside the heat sink 13. The heat sink 13 is cooled by the first cooling water flowing inside the heat sink 13 to thereby accelerate cooling of the module 11a. The module 11a attached to the heat sink 13 is an example of an "electric device". Hereinafter, the module 11a will be referred to as an "electric device 11a" for the sake of convenience.

The controller 14 controls the plurality of switching elements included in the power conversion circuit 11 according to PWM (Pulse Width Modulation) control, for example, to thereby perform desired power conversion. The controller 14 includes a current detection unit 14a. The current detection unit 14a calculates a current value of the output current output from the power conversion device 2 to the second power line 17 on the basis of the detection current generated by the current transformer 12. The controller 14 performs control and over-current protection of the power conversion circuit 11 on the basis of the calculated current value of the output current. In the present embodiment, the controller 14 outputs the calculated current value of the output current to a controller 29 of the cooling device 3 to be described later. Instead of this, the detection current generated by the current transformer 12 may be output directly to the controller 29 of the cooling device 3, and the current value of the output current may be calculated by the controller 29 of the cooling device 3.

<3. Configuration of Cooling Device>

Next, the cooling device 3 will be described. For example, the cooling device 3 includes a heat exchanger 20, a first pipe 21, a pump 22, a valve 23, a second pipe 24, a bypass pipe 25, an electromagnetic valve 26, a first temperature sensor 27A, a second temperature sensor 27B, a storage unit 28, and a controller 29.

The heat exchanger 20 includes a passage 20a through which a first cooling water flows and a passage 20b through which a second cooling water flows. In the heat exchanger 20, heat is exchanged between the first cooling water and the second cooling water. The first cooling water is a cooling water that circulates between the heat exchanger 20 and the heat sink 13 of the power conversion device 2 to cool the heat sink 13. The first cooling water is pure water, for example. On the other hand, the second cooling water is a cooling water that circulates between the external heat exchanger 4 to be described later and the heat exchanger 20 to cool the first cooling water heated by the heat sink 13 with the aid of the heat exchanger 20. The second cooling water is industrial water called an external water, for example. The heat exchanger 20 is an example of a "first heat exchanger".

The first pipe 21 couples the heat exchanger 20 with the heat sink 13 of the power conversion device 2 so that the first cooling water circulates between the heat exchanger 20 and the heat sink 13. For example, the first pipe 21 has a first pipe portion 21a and a second pipe portion 21b. The first pipe portion 21a extends between a first cooling water outlet of the heat exchanger 20 and a cooling water inlet of the heat sink 13 and guides the first cooling water cooled by the heat exchanger 20 to the heat sink 13. On the other hand, the second pipe portion 21b extends between a cooling water outlet of the heat sink 13 and a first cooling water inlet of the heat exchanger 20 and guides the first cooling water heated while passing through the inside the heat sink 13 to the heat exchanger 20.

The pump 22 and the valve 23 are provided in the first pipe 21. When the valve 23 is open and the pump 22 is driven, the first cooling water flows through the first pipe 21. In the present embodiment, the rotational speed of the pump 22 is a fixed value and the quantity of the first cooling water flowing through the first pipe 21 is always constant. When the quantity of the first cooling water flowing through the first pipe 21 varies, the controller 29 to be described later may detect the quantity of the first cooling water on the basis of a signal corresponding to the rotational speed of the pump 22. Moreover, instead of this, a flow rate sensor may be provided in the first pipe 21, and a detection result of the flow rate sensor may be output to the controller 29.

The second pipe 24 is provided to couple the external heat exchanger 4 to be described later and the heat exchanger 20 so that the second cooling water circulates between the external heat exchanger 4 and the heat exchanger 20. For example, the second pipe 24 has a first pipe portion 24a and a second pipe portion 24b. The first pipe portion 24a extends between a cooling water outlet of the external heat exchanger 4 and a second cooling water inlet of the heat exchanger 20 and guides the second cooling water cooled while passing through the inside of the external heat exchanger 4 to the heat exchanger 20. On the other hand, the second pipe portion 24b extends between a second cooling water outlet of the heat exchanger 20 and a cooling water inlet of the external heat exchanger 4 and guides the second cooling water heated by the heat exchanger 20 to the external heat exchanger 4.

The bypass pipe 25 branches from the second pipe 24 so that at least a part of the second cooling water flowing through the second pipe 24 returns to the second pipe 24 without passing through the heat exchanger 20. For example, one end of the bypass pipe 25 is connected to the middle of the first pipe portion 24a of the second pipe 24. The other end of the bypass pipe 25 is connected to the middle of the second pipe portion 24b of the second pipe 24.

The electromagnetic valve 26 is provided in the bypass pipe 25 to change the quantity of the second cooling water flowing from the second pipe 24 into the bypass pipe 25. In the present embodiment, the electromagnetic valve 26 is switched between a closed state of closing the bypass pipe 25 and an open state of opening the bypass pipe 25 on the basis of a control command from the controller 29 to be described later. When the electromagnetic valve 26 is switched to the open state, a part of the second cooling water flows from the second pipe 24 into the bypass pipe 25. As a result, the quantity of the second cooling water flowing from the second pipe 24 into the heat exchanger 20 decreases. On the other hand, when the electromagnetic valve 26 is switched to the closed state, the second cooling water does not flow from the second pipe 24 into the bypass pipe 25. As a result, the quantity of the second cooling water flowing from the second pipe 24 into the heat exchanger 20 increases. That is, the cooling device 3 is switched between a "first state" and a "second state" by the electromagnetic valve 26. The second state is a state in which the quantity of the second cooling water flowing from the second pipe 24 into the bypass pipe 25 is larger than that in the first state. In other words, the second state is a state in which the quantity of the second cooling water flowing from the second pipe 24 into the heat exchanger 20 is smaller than that in the first state.

The configuration of the electromagnetic valve 26 is not limited to the above example. For example, the electromagnetic valve 26 may be able to be controlled in a plurality of degrees of opening and may be able to switch the quantity of the second cooling water flowing from the second pipe 24 into the bypass pipe 25 in a plurality of steps. That is, the first state may be a state in which a relatively small quantity of second cooling water flows through the bypass pipe 25 without being limited to a state in which the second cooling water does not flow through the bypass pipe 25. The electromagnetic valve 26 is an example of a "flow changing mechanism". The "flow changing mechanism" is not limited to the electromagnetic valve provided in the bypass pipe 25 and may be a three-way valve provided in a connection portion between the second pipe 24 and the bypass pipe 25.

In the present embodiment, the bypass pipe 25 and the electromagnetic valve 26 are provided to suppress freezing of the first cooling water, for example. More specifically, the controller 29 to be described later receives a detection result of the first temperature sensor 27A from the first temperature sensor 27A (to be described later) provided in the first pipe 21, for example. In a case where the detection result of the first temperature sensor 27A satisfies a predetermined condition (for example, in a case where the temperature of the first cooling water is smaller than a threshold set for freezing suppression), the controller 29 controls the electromagnetic valve 26 so that the bypass pipe 25 is opened. In this way, the quantity of the second cooling water flowing from the second pipe 24 into the heat exchanger 20 decreases, and heat exchange between the first cooling water and the second cooling water in the heat exchanger 20 is suppressed. In this way, in a case where the temperature of the first cooling water is already low, excessive cooling of the first cooling water is suppressed and freezing of the first cooling water is suppressed.

The cooling device 3 has the freezing suppression function, for example, when it is expected that the cooling device 3 will be used in a place (for example, a cold region) where the first cooling water may freeze. However, the freezing prevention function is not an essential function of the cooling device 3. That is, the cooling device 3 may not have the freezing suppression function. In other words, the bypass pipe 25 and the electromagnetic valve 26 may be provided for other purposes (for example, only a function of suppressing variation in temperature of the heat sink 13 to be described later) different from the function of suppression freezing of the first cooling water.

The first temperature sensor 27A is provided in the second pipe portion 21b of the first pipe 21. For example, the first temperature sensor 27A may be provided in an end portion of the second pipe portion 21b connected to the cooling water outlet of the heat sink 13. The first temperature sensor 27A detects the temperature (a cooling water outlet temperature $T_{out}$ to be described later) of the first cooling water in the cooling water outlet of the heat sink 13. The first temperature sensor 27A may be provided in the heat sink 13 instead of the first pipe 21. The detection result of the first temperature sensor 27A is output to the controller 29.

The second temperature sensor 27B is provided in the first pipe portion 24a of the second pipe 24. The second temperature sensor 27B detects the temperature (an external water temperature $T_a$ to be described later) of the second cooling water in the second cooling water inlet of the heat exchanger 20. The detection result of the second temperature sensor 27B is output to the controller 29.

The storage unit 28 stores various pieces of information necessary for controlling the cooling device 3. The storage unit 28 stores "current-loss characteristics" calculated during designing of the power conversion device 2, for example. The current-loss characteristics are a correspondence between a current value of the output current of the power conversion device 2 (or the electric device 11a) and a power loss value of the power conversion device 2 (or the electric device 11a).

The controller 29 controls the entire cooling device 3. For example, the controller 29 controls the pump 22, the valve 23, and the electromagnetic valve 26. The controller 29 will be described in detail later.

<4. External Heat Exchanger and External Pump>

Next, the external heat exchanger 4 and the external pump 5 will be described.

The external heat exchanger 4 is disposed outside the cooling device 3, for example. The external heat exchanger 4 is a cooling tower, for example, and cools the second cooling water by bringing the second cooling water into direct or indirect contact with the atmosphere. However, the configuration of the external heat exchanger 4 is not limited to the above example and may be a heat exchanger including a blower, for example. The external heat exchanger 4 is an example of a "second heat exchanger".

The external pump 5 is provided in the second pipe 24. When the external pump 5 is driven, the second cooling water flows through the second pipe 24. The external pump 5 may be provided as a part of the cooling device 3.

<5. Functional Configuration of Controller>

Next, a functional configuration of the controller 29 will be described. The controller 29 of the embodiment has a function of suppressing variation in temperature of the heat sink 13. Specifically, the controller 29 monitors a detection value related to at least one of a power loss of the electric device 11a and a temperature of the first cooling water. When the detection value is smaller than a first threshold, the controller 29 controls the electromagnetic valve 26 so that the quantity of the second cooling water flowing from the second pipe 24 into the bypass pipe 25 increases. In this way, the quantity of the second cooling water flowing from the second pipe 24 into the heat exchanger 20 is decreased to curb excessive cooling of the heat sink 13. On the other hand, when the detection value is equal to or larger than a second threshold, the controller 29 controls the electromagnetic valve 26 so that the quantity of the second cooling water flowing from the second pipe 24 into the bypass pipe 25 decreases (for example, is restored to an original amount). In this way, the quantity of the second cooling water flowing from the second pipe 24 into the heat exchanger 20 increases (for example, is restored to an original amount) and cooling of the heat sink 13 is performed efficiently.

In the present embodiment, an example in which a value related to a power loss of the electric device 11a is monitored as the detection value will be described. Specifically, in the present embodiment, the power loss itself of the electric device 11a is monitored on the basis of the current value of the output current of the power conversion device 2 (or the electric device 11a). On the other hand, an example in which a value related to the temperature of the first cooling water is monitored as the detection value will be described later as a second embodiment.

In the present embodiment, an example in which the "first threshold" and the "second threshold" are set as the same value (for example, a threshold $W_{th}$ to be described later) will be described. That is, the threshold $W_{th}$ to be described later is an example of the "first threshold" and is an example of the "second threshold". The "first threshold" and the "second threshold" may be different values.

<5.1 Overview of Control>

In the present embodiment, the controller 29 determines whether a predetermined first condition to be described later is satisfied. When it is determined that the first condition is satisfied, the controller 29 controls the cooling device 3 in a first control mode. On the other hand, when it is determined that the first condition is not satisfied, the controller 29 controls the cooling device 3 in a second control mode. The first control mode and the second control mode use different threshold values for switching between the open/closed state of the electromagnetic valve 26 (switching the cooling device 3 between a first state and a second state). Hereinafter, the first control mode and the second control mode will be described, respectively.

<5.2 First Control Mode>

First, some physical quantities will be defined.

$T_{in}$ is a cooling water inlet temperature (temperature of the first cooling water in the cooling water inlet of the heat sink 13) [° C.].

$T_{out}$ is a cooling water outlet temperature (temperature of the first cooling water in the cooling water outlet of the heat sink 13) [° C.].

$T_{out\_H}$ is a cooling water outlet temperature $T_{out}$ when it is assumed that the power conversion device 2 (the electric device 11a) operates with the largest power loss in the first state. Hereinafter, $T_{out\_H}$ is sometimes referred to as a "third reference temperature".

$T_{out\_L}$ is a cooling water outlet temperature $T_{out}$ when it is assumed that the power conversion device 2 (the electric device 11a) operates with the smallest power loss in the first state. Hereinafter, $T_{out\_L}$ is sometimes referred to as a "first reference temperature".

$T_{out\_L}'$ is a cooling water outlet temperature $T_{out}$ when it is assumed that the power conversion device 2 (the electric device 11a) operates with the smallest power loss in the second state. Hereinafter, $T_{out\_L}'$ is sometimes referred to as a "second reference temperature".

$\Delta T$ is a temperature difference between $T_{out\_H}$ and $T_{out\_L}$.

$\Delta T'$ is a temperature difference between $T_{out\_H}$ and $T_{out\_L}'$.

$T_a$ is an external water temperature (temperature of the second cooling water in the second cooling water inlet of the heat exchanger 20) [° C.].

$W$ is a power loss [W] of the electric device 11a.

$W_{max}$ is the largest power loss during operation [W] of the electric device 11a. The largest power loss during operation $W_{max}$ is calculated in advance according to a load pattern of the power conversion device 2 (the electric device 11a) and is stored in the storage unit 28.

$W_{min}$ is the smallest power loss during operation [W] of the electric device 11a. The smallest power loss during operation $W_{min}$ is calculated in advance according to a load pattern of the power conversion device 2 (the electric device 11a) and is stored in the storage unit 28.

$W_{th}$ is a threshold related to the power loss $W$ of the electric device 11a set to switch the open/closed state of the electromagnetic valve 26 in the control of suppressing variation in temperature of the heat sink 13.

$C$ is a specific heat capacity [J/(g·k)] of the first cooling water. The specific heat capacity $C$ is stored in the storage unit 28.

$\rho$ is the density [g/cm$^2$] of the first cooling water. The density $\rho$ is stored in the storage unit 28.

$Q$ is the quantity [L/min] of the first cooling water. The quantity $Q$ is calculated in advance and is stored in the storage unit 28. However, when the quantity $Q$ varies, the controller 29 may calculate the quantity $Q$ on the basis of a control amount of the rotational speed of the pump 22 or the detection result of the flow rate sensor provided in the first pipe 21.

$\varepsilon$ is a temperature efficiency (heat exchange efficiency) of the heat exchanger 20.

$\varepsilon_1$ is a temperature efficiency P of the heat exchanger 20 in the closed state of the electromagnetic valve 26 (that is, the first state of the cooling device 3).

$\varepsilon_2$ is a temperature efficiency E of the heat exchanger 20 in the open state of the electromagnetic valve 26 (that is, the second state of the cooling device 3).

The temperature efficiency $\varepsilon$ of the heat exchanger 20 can be calculated by Equation (1). Equation (1) is a definitional equation of the temperature efficiency of a heat exchanger.

[Math. 1]

$$\varepsilon = \frac{T_{out} - T_{in}}{T_{out} - T_a} = \frac{C\rho\left(\frac{1000}{60}Q\right)}{T_{out} - T_a} \quad (1)$$

The cooling water outlet temperature $T_{out}$ can be calculated by Equation (2). Equation (2) is obtained by modifying Equation (1).

[Math. 2]

$$T_{out} = \frac{W}{\varepsilon C\rho\left(\frac{1000}{60}Q\right)} + T_a \quad (2)$$

The cooling water outlet temperature $T_{out\_H}$ can be calculated by Equation (3).

[Math. 3]

$$T_{out\_H} -= \frac{W_{max}}{\varepsilon_1 C\rho\left(\frac{1000}{60}Q\right)} + T_a \quad (3)$$

The cooling water outlet temperature $T_{out\_L}$ can be calculated by Equation (4).

[Math. 4]

$$T_{out\_L} = \frac{W_{min}}{\varepsilon_1 C\rho\left(\frac{1000}{60}Q\right)} + T_a \quad (4)$$

The temperature difference ΔT can be calculated by Equation (5).

[Math. 5]
$$\Delta T = T_{out\_H} - T_{out\_L} = \frac{W_{max} - W_{min}}{\varepsilon_1 C \rho \left(\frac{1000}{60} Q\right)} \quad (5)$$

The cooling water outlet temperature $T_{out\_L}'$ can be calculated by Equation (6).

[Math. 6]
$$T_{out\_L}' = \frac{W_{min}}{\varepsilon_2 C \rho \left(\frac{1000}{60} Q\right)} + T_a \quad (6)$$

The temperature ΔT' can be calculated by Equation (7).

[Math. 7]
$$\Delta T' = T_{out\_H} - T_{out\_L}' = \frac{\varepsilon_2 W_{max} - \varepsilon_1 W_{min}}{\varepsilon_1 \varepsilon_2 C \rho \left(\frac{1000}{60} Q\right)} \quad (7)$$

The difference between the temperature differences ΔT and ΔT' can be calculated by Equation (8).

[Math. 8]
$$\Delta T - \Delta T' = \frac{(\varepsilon_1 - \varepsilon_2) W_{min}}{\varepsilon_1 \varepsilon_2 C \rho \left(\frac{1000}{60} Q\right)} \quad (8)$$

Figure 2:
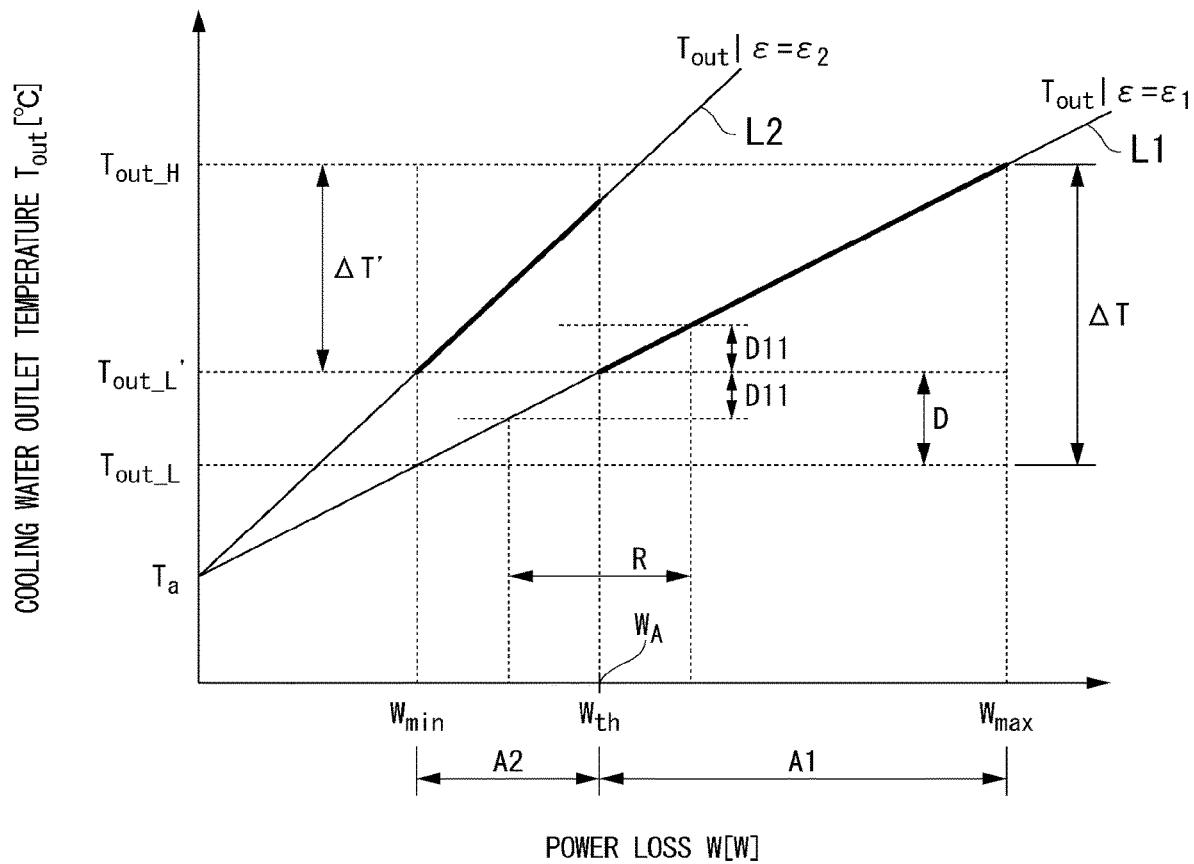
FIG. 2 is a diagram for describing a first control mode of the first embodiment.

FIG. 2 is a diagram for describing a first control mode. A straight line L1 in FIG. 2 indicates a relationship between the cooling water outlet temperature $T_{out}$ and the power loss W of the electric device 11a when it is assumed that the power conversion device 2 (the electric device 11a) operates in the first state. On the other hand, a straight line L2 in FIG. 2 indicates a relationship between the cooling water outlet temperature $T_{out}$ and the power loss W of the electric device 11a when it is assumed that the power conversion device 2 (the electric device 11a) operates in the second state.

In the present embodiment, a threshold $W_{th}$ is set to switch the open/closed state of the electromagnetic valve 26. The controller 29 monitors a detection value of the power loss of the electric device 11a specifically according to a method to be described later. When the detection value of the power loss is in a region (region A1) of the threshold $W_{th}$ or more, the controller 29 puts the cooling device 3 into the first state by controlling the electromagnetic valve 26 such that it is brought into the closed state. On the other hand, when the detection value of the power loss is in a region (region A2) of smaller than the threshold $W_{th}$, the controller 29 puts the cooling device 3 into the second state by putting the electromagnetic valve 26 into the open state. That is, in this case, the cooling device 3 is controlled with the characteristics indicated by a bold line in FIG. 2.

Next, an example of the threshold $W_{th}$ in the first control mode will be described.

The threshold $W_{th}$ is a value related to the power loss W and is set to be within a range (the range R in FIG. 2) in which, when it is assumed that the electric device 11a operates in the first state, a difference D11 between the temperature (the temperature value on the straight line L1) of the first cooling water and the second reference temperature $T_{out\_L}'$ is equal to or smaller than half a difference D between the first reference temperature $T_{out\_L}$ and the second reference temperature $T_{out\_L}'$, for example. That is, an example of the threshold $W_{th}$ is an arbitrary value within the range R. It is assumed that ΔT'<ΔT.

In the example illustrated in FIG. 2, the threshold $W_{th}$ is set to a value $W_A$ at which the temperature (the temperature value on the straight line L1) of the first cooling water when it is assumed that the electric device 11a operates in the first state is the second reference temperature $T_{out\_L}'$.

In this case, the threshold $W_{th}$ is obtained by solving Equation (9) below and is calculated by Equation (10).

[Math. 9]
$$T_{out\_L}' = \frac{W_{th}}{\varepsilon_1 C \rho \left(\frac{1000}{60} Q\right)} + T_a \quad (9)$$

[Math. 10]
$$W_{th} = \frac{\varepsilon_1}{\varepsilon_2} W_{min} \quad (10)$$

Figure 3:
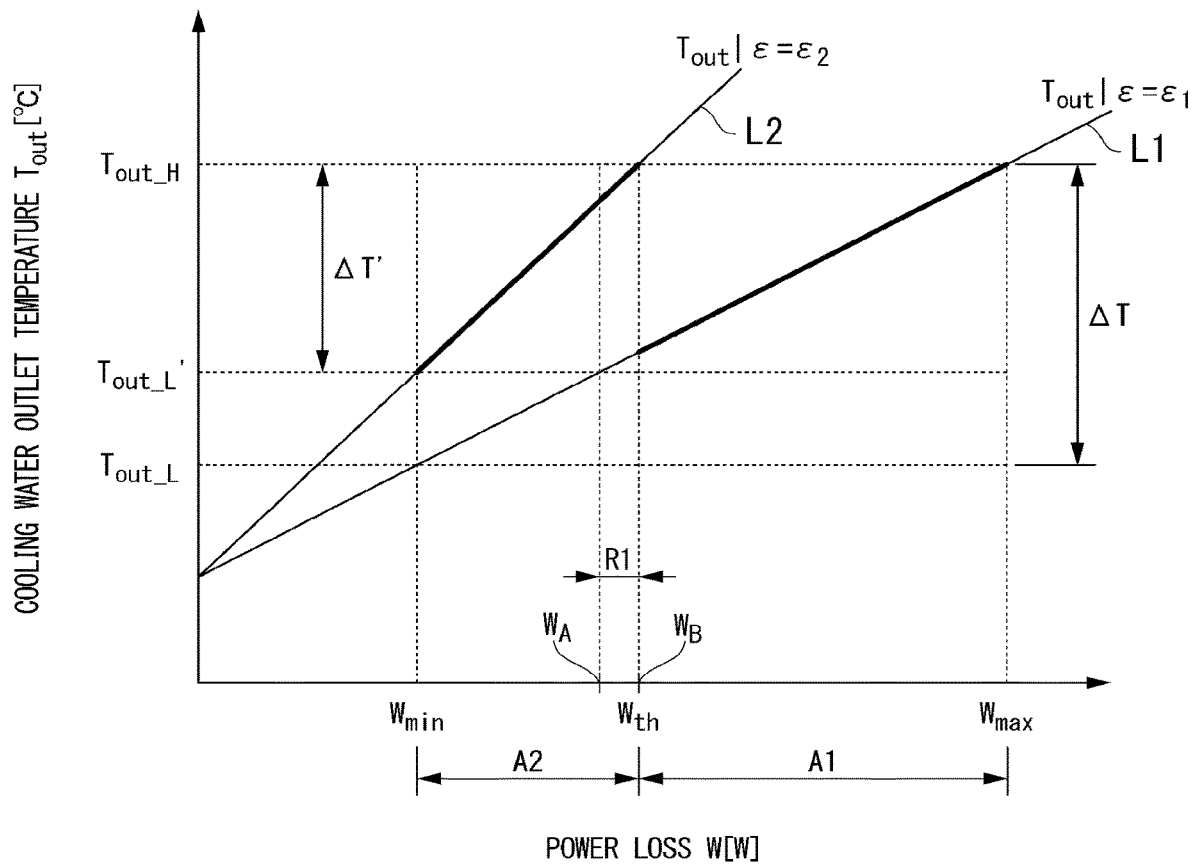
FIG. 3 is a diagram for describing a first control mode of the first embodiment.

FIG. 3 is another diagram for describing the first control mode. FIG. 3 illustrates another example of the threshold $W_{th}$ in the first control mode. In the example illustrated in FIG. 3, the threshold $W_{th}$ is set to a value $W_B$ at which the temperature (the temperature value on the straight line L2) of the first cooling water when it is assumed that the electric device 11a operates in the second state is the third reference temperature $T_{out\_H}$. That is, in this case, the cooling device 3 is controlled with the characteristics indicated by a bold line in FIG. 3.

That is, according to one viewpoint, the threshold $W_{th}$ may be set to be within a range (the range R1 in FIG. 3) from the value $W_A$ at which the temperature (the temperature value on the straight line L1) of the first cooling water when it is assumed that the electric device 11a operates in the first state is the second reference temperature $T_{out\_L}'$, to the value $W_B$ at which the temperature of the first cooling water when it is assumed that the electric device 11a operates in the second state is the third reference temperature $T_{out\_H}$.

<5.3 Second Control Mode>

Next, the second control mode will be described.

Figure 4:
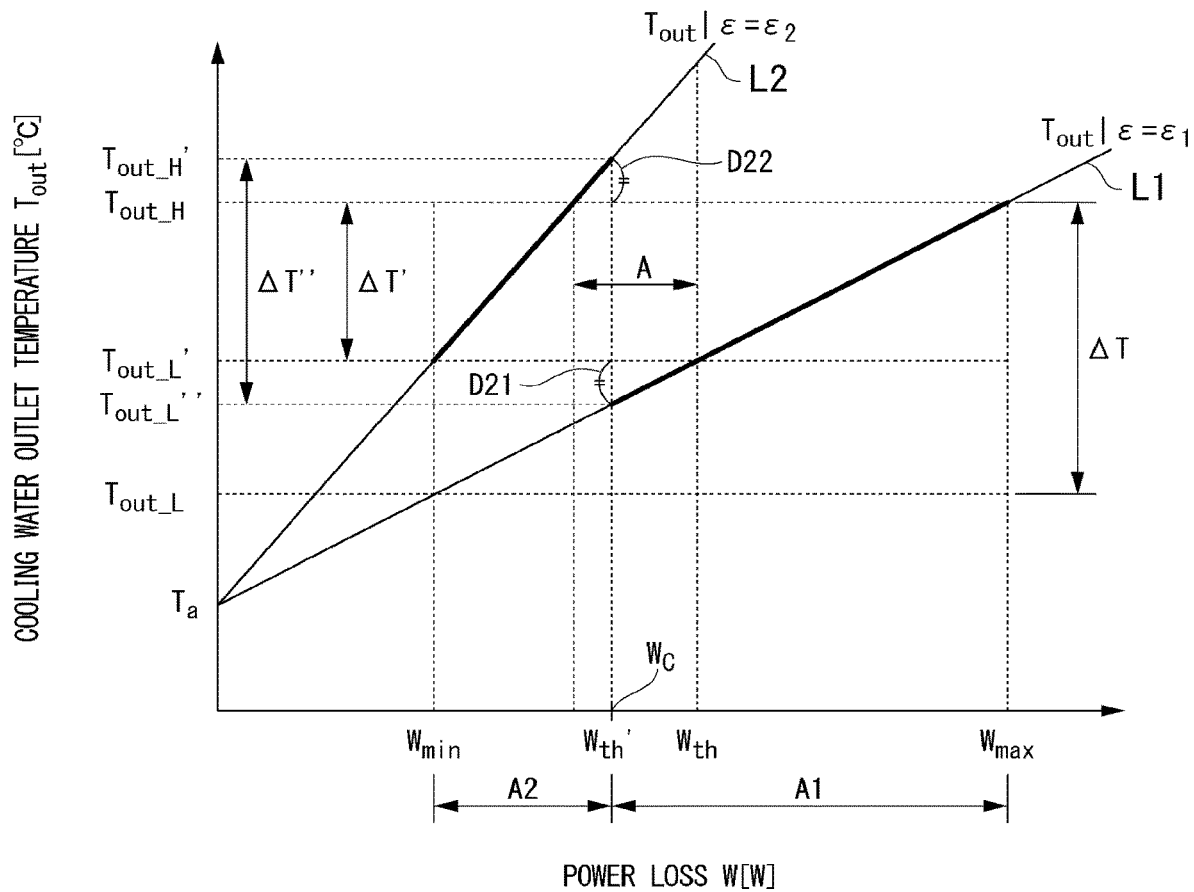
FIG. 4 is a diagram for describing a second control mode of the first embodiment.

FIG. 4 is a diagram for describing the second control mode. Here, in the cooling device 3, the temperature efficiencies $\varepsilon_1$ and $\varepsilon_2$ of the heat exchanger 20 may differ greatly due to at least one of the largest power loss during operation $W_{max}$ of the electric device 11a, the smallest power loss during operation $W_{min}$ of the electric device 11a, the external water temperature $T_a$, and the quantity Q of the first cooling water. When the temperature efficiencies $\varepsilon_1$ and $\varepsilon_2$ of the heat exchanger 20 differ greatly, as indicated by the region A in FIG. 4, the cooling water outlet temperature $T_{out}$ may not fall within the range of ΔT' ($T_{out\_H}$ to $T_{out\_L}'$) in the closed state or the open state of the electromagnetic valve 26.

A condition where such a phenomenon occurs is a case where Equation (11) below is satisfied and the equation is modified as Equation (12).

[Math. 11]

$$\frac{W_{th}}{\varepsilon_2 C\rho\left(\dfrac{1000}{60}Q\right)} + T_a > T_{out\_H} \quad (11)$$

[Math. 12]

$$\frac{\varepsilon_1}{\varepsilon_2} > \sqrt{\frac{W_{max}}{W_{min}}} \quad (12)$$

That is, when the condition of Equation (12) is satisfied, it is preferable that the cooling device 3 be controlled in a second control mode different from the first control mode rather than the first control mode.

In this case, the controller 29 uses a threshold $W_{th}'$ instead of the threshold $W_{th}$. The threshold $W_{th}'$ is a threshold related to a power loss [W] of the electric device 11a set to switch the open/closed state of the electromagnetic valve 26 in the control of suppressing variation in temperature of the heat sink 13 similarly to the threshold $W_{th}$. The threshold $W_{th}'$ is another example of the "first threshold" and is another example of the "second threshold".

In the example illustrated in FIG. 4, the threshold $W_{th}'$ is set to a value $W_C$ at which a first difference D21 and a second difference D22 are equal to each other when the first difference D21 is a difference between the temperature (the temperature value on the straight line L1) of the first cooling water when it is assumed that the electric device 11a operates in the first state and the second reference temperature $T_{out\_L}'$ and the second difference D22 is a difference between the temperature (the temperature value on the straight line L2) of the first cooling water when it is assumed that the electric device 11a operates in the second state and the third reference temperature $T_{out\_H}$. That is, in this case, the cooling device 3 is controlled with the characteristics indicated by a bold line in FIG. 4. The first and second differences D21 and D22 are deviation values from the range of ΔT'. In this case, a variation width of $T_{out}$ is T" ($T_{out\_L}''$ to $T_{out\_H}'$).

In this case, the threshold $W_{th}'$ is calculated by solving Equation (13) below and is calculated by Equation (14).

[Math. 13]

$$T_{out}|_{\varepsilon=\varepsilon_2} - T_{out\_H} = T_{out\_L}' - T_{out}|_{\varepsilon=\varepsilon_2} \quad (13)$$

[Math. 14]

$$W_{th}' = \frac{\varepsilon_1 W_{min} + \varepsilon_2 W_{max}}{\varepsilon_1 + \varepsilon_2} \quad (14)$$

In this case, calculation formulae are obtained as Equations (15) to (17) below, and a variation width of $T_{out}$ that can be reduced is obtained as in Equation (18).

[Math. 15]

$$T_{out\_H}' = \frac{W_{th}}{\varepsilon_2 C\rho\left(\dfrac{1000}{60}Q\right)} + T_a \quad (15)$$

[Math. 16]

$$T_{out\_L}'' = \frac{W_{th}}{\varepsilon_1 C\rho\left(\dfrac{1000}{60}Q\right)} + T_a \quad (16)$$

[Math. 17]

$$\Delta T'' = T_{out\_H}' - T_{out\_L}'' = \frac{(\varepsilon_1 - \varepsilon_2)(\varepsilon_2 W_{max} + \varepsilon_1 W_{min})}{\varepsilon_1 \varepsilon_2 (\varepsilon_1 + \varepsilon_2) C\rho\left(\dfrac{1000}{60}Q\right)} \quad (17)$$

[Math. 18]

$$\Delta T - \Delta T'' = \frac{2\varepsilon_2^2 W_{max} - (\varepsilon_1^2 + \varepsilon_2^2)W_{min}}{\varepsilon_1 \varepsilon_2 (\varepsilon_1 + \varepsilon_2) C\rho\left(\dfrac{1000}{60}Q\right)} \quad (18)$$

In this case, a condition for reducing a variation width of $T_{out}$ is that the numerator on the right side of Equation (18) is larger than 0. A case where this condition is satisfied is obtained as Equation (19) below.

[Math. 19]

$$\frac{\varepsilon_1}{\varepsilon_2} < \sqrt{\frac{2W_{max}}{W_{min}} - 1} \quad (19)$$

That is, when the condition of Equation (19) is not satisfied, if the electromagnetic valve 26 is switched to the open state at the threshold $W_{th}'$, the variation width of $T_{out}$ increases contrarily. Therefore, when the condition of Equation (19) is not satisfied, the control of the electromagnetic valve 26 is not performed. Equation (19) is a condition when $W_{th}'$ is set to We in FIG. 4.

Figure 5:
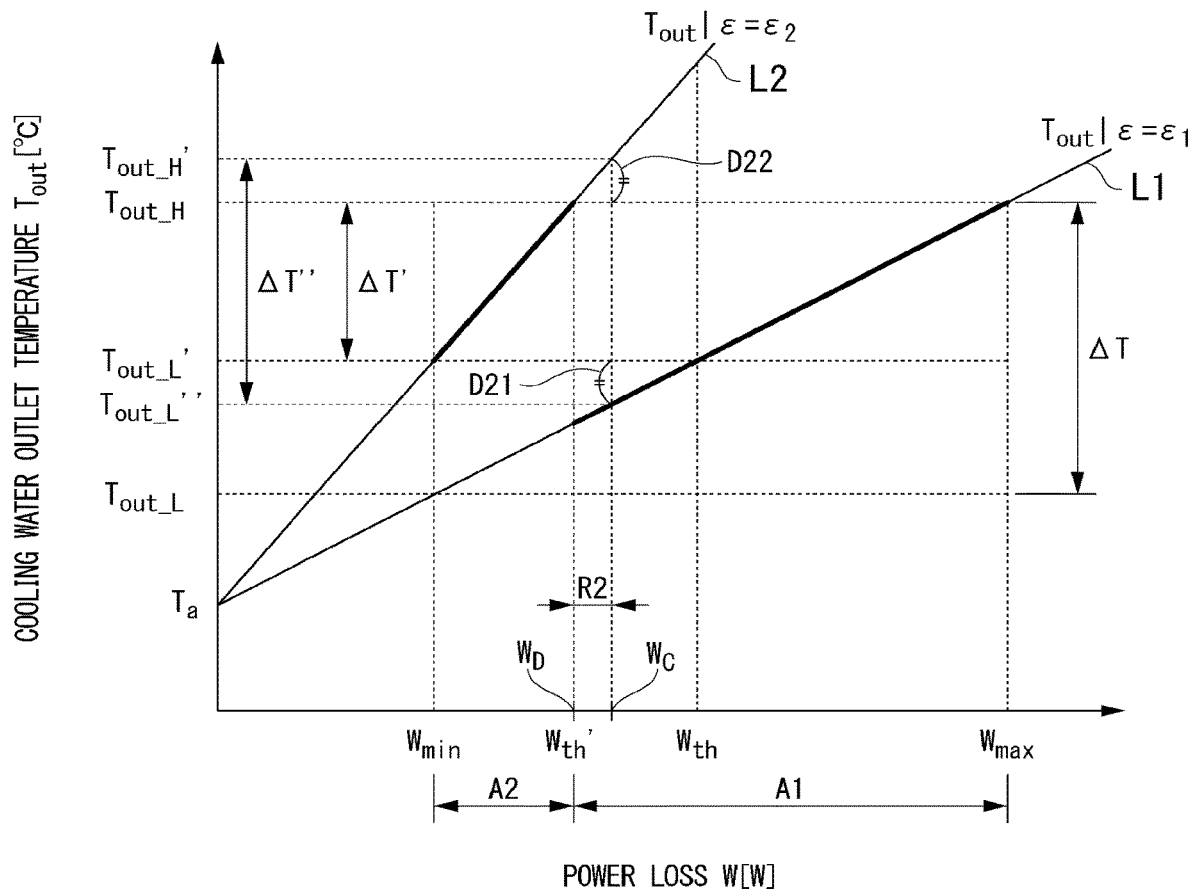
FIG. 5 is a diagram for describing a second control mode of the first embodiment.

FIG. 5 is another diagram for describing the second control mode. FIG. 5 illustrates another example of the threshold $W_{th}'$ in the second control mode. In the example illustrated in FIG. 5, the threshold $W_{th}'$ is set to a value $W_D$ at which the temperature (the temperature value on the straight line L2) of the first cooling water when it is assumed that the electric device 11a operates in the second state is the third reference temperature $T_{out\_H}$. That is, in this case, the cooling device 3 is controlled with the characteristics indicated by a bold line in FIG. 5.

That is, according to one viewpoint, the threshold $W_{th}'$ may be set to be within a range (the range R2 in FIG. 5) from the value $W_C$ at which the first and second differences D21 and D22 are equal to each other, to the value $W_D$ at which the temperature (the temperature value on the straight line L2) of the first cooling water when it is assumed that the electric device 11a operates in the second state is the third reference temperature $T_{out\_H}$.

When $W_{th}'$ is set to $W_D$ in FIG. 5, a condition that the control of the electromagnetic valve 26 is not performed (the condition corresponding to Equation (19)) may be that the condition of Equation (20) below is not satisfied.

[Math. 20]

$$\frac{\varepsilon_1}{\varepsilon_2} < \frac{W_{max}}{W_{min}} \quad (20)$$

However, Equation (20) is a looser condition than Equation (19). Therefore, it is not necessary to strictly define Equation (20), and even when $W_{th}'$ is set to $W_D$, if the condition of Equation (19) is not satisfied, the control of the electromagnetic valve 26 may not be performed.

<5.4 Functional Configuration of Controller>

Figure 6:
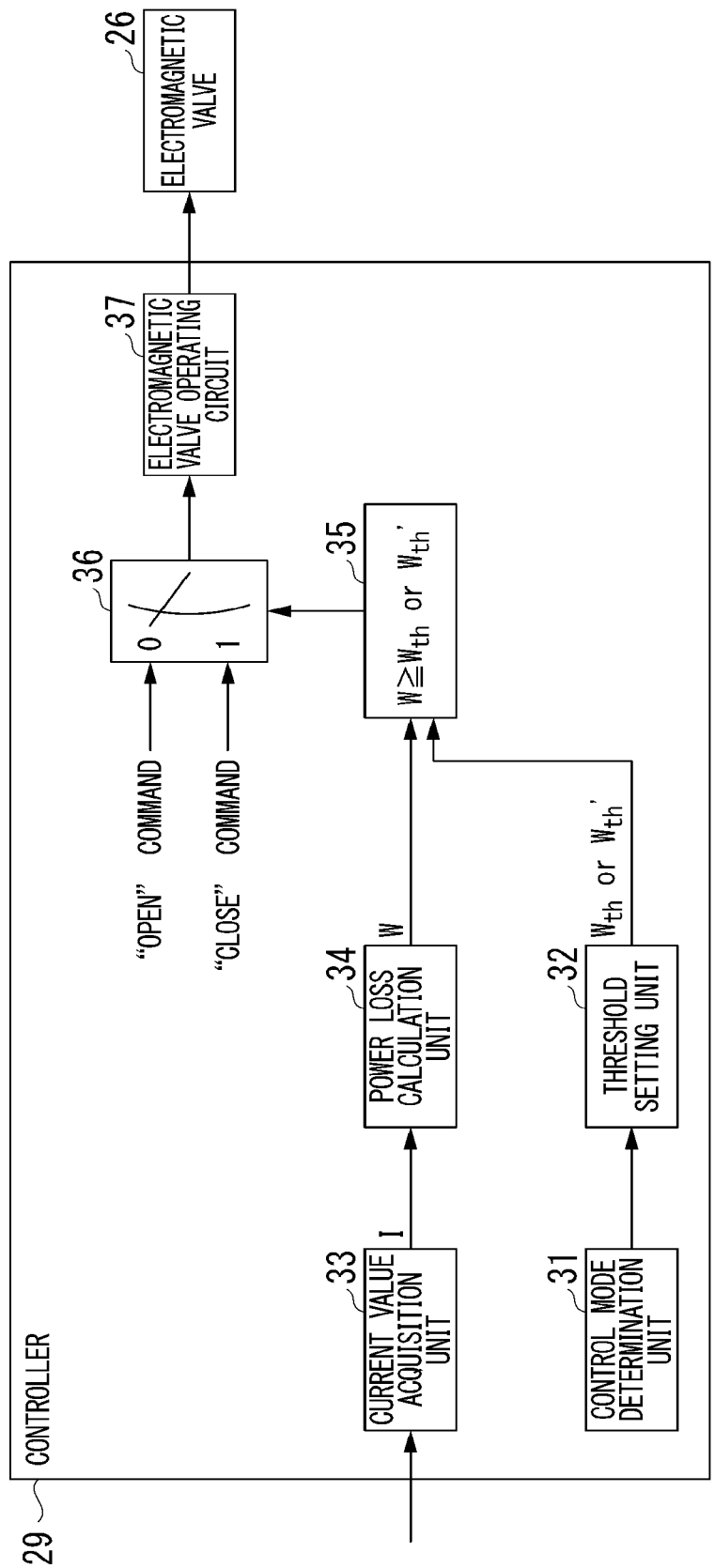
FIG. 6 is a block diagram illustrating a functional configuration of a controller of the first embodiment.

FIG. 6 is a block diagram illustrating a functional configuration of the controller 29. For example, the controller 29 includes a control mode determination unit 31, a threshold setting unit 32, a current value acquisition unit 33, a power loss calculation unit 34, a comparing unit (monitoring unit) 35, an opening/closing determination unit 36, and an electromagnetic valve operating circuit 37. In the following description, it is assumed that the electromagnetic valve 26 is in the closed state when the operation of the cooling device 3 starts.

The control mode determination unit 31 calculates the temperature efficiencies $\varepsilon_1$ and $\varepsilon_2$ of the heat exchanger 20, for example, on the basis of the quantity Q of the first cooling water stored in the storage unit 28, the specific heat capacity C of the first cooling water stored in the storage unit 28, the density $\rho$ of the first cooling water stored in the storage unit 28, the cooling water outlet temperature $T_{out}$ detected by the first temperature sensor 27A, the external water temperature $T_a$ detected by the second temperature sensor 27B, and the power loss W detected by the power loss calculation unit 34. For example, the temperature efficiencies $\varepsilon_1$ and $\varepsilon_2$ are calculated in advance on the basis of the cooling water outlet temperature $T_{out}$, the external water temperature $T_a$, and the power loss W detected when the cooling device 3 is operated in advance in the first and second states during a preliminary operation of the drive system 1.

Subsequently, the control mode determination unit 31 determines whether a first condition which is Equation (21) below is satisfied on the basis of the calculated temperature efficiencies $\varepsilon_1$ and $\varepsilon_2$ of the heat exchanger 20 and the largest power loss during operation $W_{max}$ and the smallest power loss during operation $W_{min}$ stored in the storage unit 28.

[Math. 21]

$$\frac{\varepsilon_1}{\varepsilon_2} \leq \sqrt{\frac{W_{max}}{W_{min}}} \quad (21)$$

In a case where it is determined that the first condition is satisfied, the control mode determination unit 31 determines that the cooling device 3 is to be controlled in the first control mode and notifies the threshold setting unit 32 of the fact that the cooling device 3 is to be controlled in the first control mode.

On the other hand, in a case where it is determined that the first condition is not satisfied, the control mode determination unit 31 determines whether a second condition which is Equation (22) below is satisfied on the basis of the calculated temperature efficiencies $\varepsilon_1$ and $\varepsilon_2$ of the heat exchanger 20 and the largest power loss during operation $W_{mnax}$ and the smallest power loss during operation $W_{min}$ stored in the storage unit 28.

[Math. 22]

$$\frac{\varepsilon_1}{\varepsilon_2} < \sqrt{\frac{2W_{max}}{W_{min}} - 1} \quad (22)$$

In a case where it is determined that the second condition is satisfied, the control mode determination unit 31 determines that the cooling device 3 is to be controlled in the second control mode and notifies the threshold setting unit 32 of the fact that the cooling device 3 is to be controlled in the second control mode. On the other hand, in a case where it is determined that the second condition is not satisfied, the controller 29 maintains the electromagnetic valve 26 in the closed state.

In a case where the control mode determination unit 31 determines that the cooling device 3 is to be controlled in the first control mode, the threshold setting unit 32 sets the threshold $W_{th}$ as a switching point at which the open/closed state of the electromagnetic valve 26 is switched. The value of the threshold $W_{th}$ is set in advance to an arbitrary value within the range R1 described with reference to FIG. 3, and for example, is set to the value $W_A$ at which the temperature (the temperature value on the straight line L1) of the first cooling water when it is assumed that the electric device 11a operates in the first state is the second reference temperature $T_{out\_L}'$.

On the other hand, in a case where the control mode determination unit 31 determines that the cooling device 3 is to be controlled in the second control mode, the threshold setting unit 32 sets the threshold $W_{th}'$ as a switching point at which the open/closed state of the electromagnetic valve 26 is switched. The value of the threshold $W_{th}'$ is set in advance to an arbitrary value within the range R2 described with reference to FIG. 5, and for example, is set to the value $W_B$ at which the first and second differences D21 and D22 are equal to each other. The threshold setting unit 32 outputs the set threshold $W_{th}$ or $W_{th}'$ to the comparing unit 35.

The current value acquisition unit 33 receives the current value of the output current of the power conversion device 2 detected by the controller 29 of the power conversion device 2 from the controller 29 of the power conversion device 2. The current value acquisition unit 33 outputs the received current value of the output current to the power loss calculation unit 34.

The power loss calculation unit 34 calculates the power loss W of the electric device 11a on the basis of the current value received from the current value acquisition unit 33 and the current-loss characteristics stored in the storage unit 28. The power loss calculation unit 34 outputs the calculated power loss W of the electric device 11a to the comparing unit 35. The power loss W of the electric device 11a is an example of a "detection value" used as a monitoring target.

The comparing unit (the monitoring unit) 35 monitors the power loss W calculated by the power loss calculation unit 34. In the present embodiment, the comparing unit 35 compares the threshold $W_{th}$ (or the threshold $W_{th}'$) set by the threshold setting unit 32 and the power loss W calculated by the power loss calculation unit 34 at predetermined periods. The comparing unit 35 outputs a comparison result of the power loss W and the threshold $W_{th}$ (or the threshold $W_{th}'$) to the opening/closing determination unit 36.

The opening/closing determination unit 36 determines that the electromagnetic valve 26 is to be open on the basis of the comparison result of the comparing unit 35 when the power loss W decreases to be smaller than the threshold $W_{th}$ (or the threshold $W_{th}'$) from a state in which the power loss W is equal to or larger than the threshold $W_{th}$ (or the threshold $W_{th}'$). When it is determined that the electromagnetic valve 26 is to be open, the opening/closing determination unit 36 outputs a command for opening the electromagnetic valve 26 to the electromagnetic valve operating circuit 37.

On the other hand, the opening/closing determination unit 36 determines that the electromagnetic valve 26 is to be closed on the basis of the comparison result of the comparing unit 35 when the power loss W increases to be equal to or larger than the threshold $W_{th}$ (or the threshold $W_{th}'$) from a state in which the power loss W is smaller than the threshold $W_{th}$ (or the threshold $W_{th}'$). When it is determined that the electromagnetic valve 26 is to be closed, the opening/closing determination unit 36 outputs a command for closing the electromagnetic valve 26 to the electromagnetic valve operating circuit 37.

Upon receiving the command for opening the electromagnetic valve 26 from the opening/closing determination unit 36, the electromagnetic valve operating circuit 37 outputs a control signal corresponding to an open state to the electromagnetic valve 26 so that the electromagnetic valve 26 transitions from the closed state to the open state. On the other hand, upon receiving the command for closing the electromagnetic valve 26 from the opening/closing determination unit 36, the electromagnetic valve operating circuit 37 outputs a control signal corresponding to a closed state to the electromagnetic valve 26 so that the electromagnetic valve 26 transitions from the open state to the closed state.

<5.4 Process Flow>

Next, the process flow of the controller 29 will be described.

Figure 7:
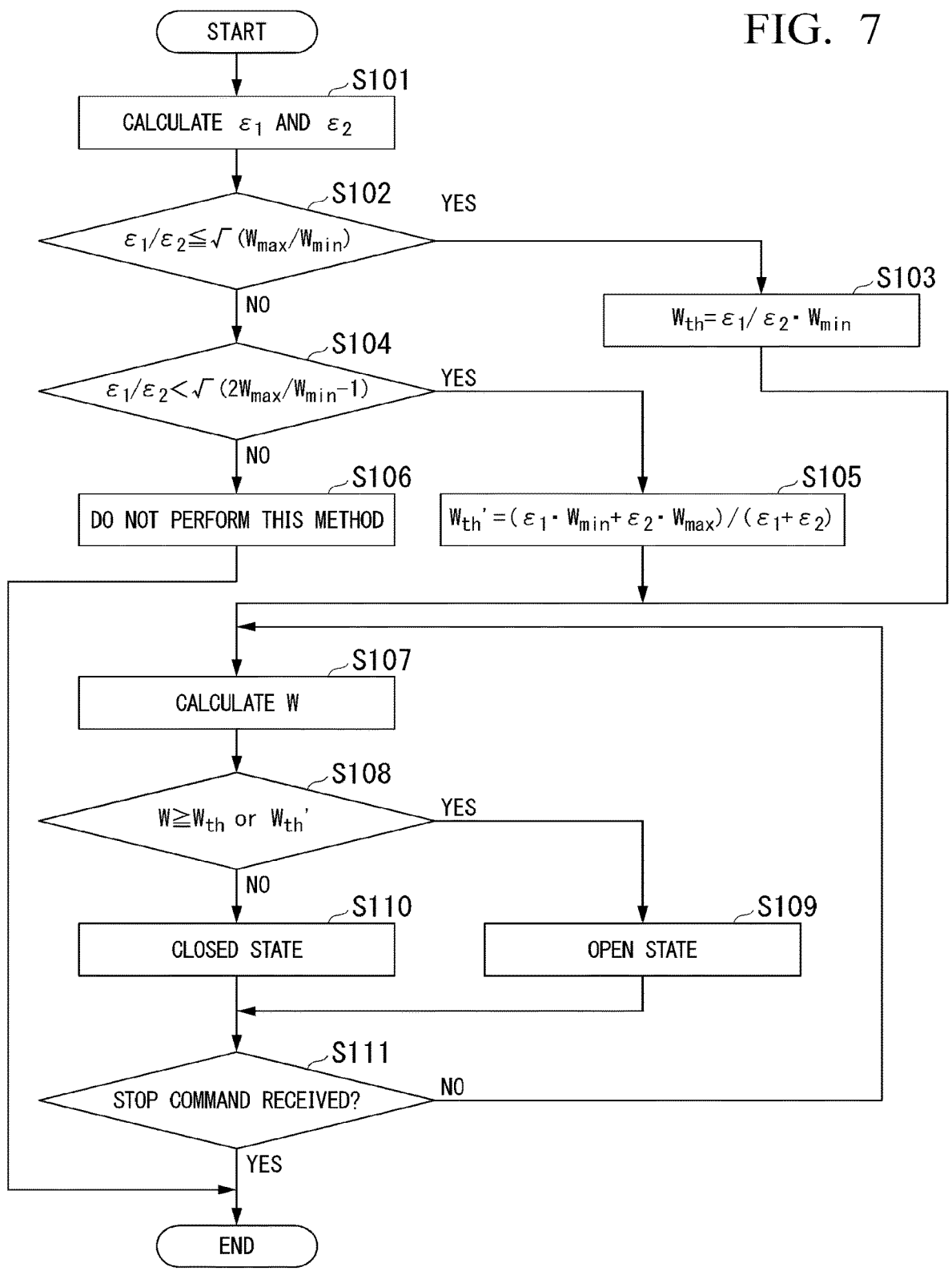
FIG. 7 is a flowchart illustrating an example of a process flow of the first embodiment.

FIG. 7 is a flowchart illustrating an example of the process flow of the controller 29. First, the controller 29 calculates the temperature efficiencies $\varepsilon_1$ and $\varepsilon_2$ of the heat exchanger 20 on the basis of the cooling water outlet temperature $T_{out}$, the external water temperature $T_a$, the quantity Q of the first cooling water, and the power loss W (S101). The process of S101 is performed in advance when the cooling device 3 is operated in advance in the first and second states during a preliminary operation of the drive system 1 as described above.

Subsequently, the controller 29 determines whether the first condition is satisfied on the basis of the temperature efficiencies $\varepsilon_1$ and $\varepsilon_2$ of the heat exchanger 20, the largest power loss during operation $W_{max}$, and the smallest power loss during operation $W_{min}$ (S102).

In a case where it is determined that the first condition is satisfied (S102: YES), the controller 29 sets the threshold $W_{th}$ as a threshold for switching the open/closed state of the electromagnetic valve 26 (S103). The controller 29 proceeds to the process of S107.

On the other hand, in a case where it is determined that the first condition is not satisfied (S102: NO), the controller 29 determines whether the second condition is satisfied on the basis of the temperature efficiencies $\varepsilon_1$ and $\varepsilon_2$ of the heat exchanger 20, the largest power loss during operation $W_{max}$, and the smallest power loss during operation $W_{min}$ (S104).

In a case where it is determined that the second condition is satisfied (S104: YES), the controller 29 sets the threshold $W_{th}'$ as a threshold for switching the state of the electromagnetic valve 26 (S105).

On the other hand, in a case where it is determined that the second condition is not satisfied (S104: NO), the controller 29 does not perform temperature variation suppression control in this method (S106) and ends this flow.

The calculations of S102 to S106 are performed in advance on the basis of the temperature efficiencies $\varepsilon_1$ and $\varepsilon_2$ obtained in S101. Moreover, the calculations of S101 to S106 are calculated again at a timing at which the parameters (for example, the quantity Q of the first cooling water, the largest power loss during operation $W_{max}$, the smallest power loss during operation $W_{min}$, and the like) of the calculation formula are updated. The controller 29 performs the processes of S107 to S110 during actual operation (cooling using the cooling device 3) of the cooling device 3.

That is, the controller 29 calculates the power loss W of the electric device 11a on the basis of a current value of the output current of the power conversion device 2 (or the electric device 11a) and the current-loss characteristics during operation of the cooling device 3 (S107). Subsequently, the controller 29 determines whether the calculated power loss W is equal to or larger than the threshold Wu, (or the threshold $W_{th}'$) (S108).

In a case where the power loss W is equal to or larger than the threshold $W_{th}$ (or the threshold $W_{th}'$) (S108: YES), the controller 29 puts the electromagnetic valve 26 into the open state (S109). On the other hand, in a case where the power loss W is smaller than the threshold $W_{th}$ (or the threshold $W_{th}'$) (S108: NO), the controller 29 puts the electromagnetic valve 26 into the closed state (S110).

Subsequently, the controller 29 determines whether a command for stopping the operation of the cooling device 3 is received (S11). When the command for stopping the operation of the cooling device 3 is not received (S111: NO), the controller 29 repeats the processes of S107 to S110 at predetermined periods. On the other hand, in a case where the command for stopping the operation of the cooling device 3 is received (S111: YES), the controller 29 stops the operation of the cooling device 3. In this way, the process of this flow ends.

(Operation)

As a comparative example, a case in which the temperature variation suppression control is not performed will be discussed. In this case, the temperature of the heat sink 13 varies with a width of $\Delta T$ in FIG. 2. When the temperature variation of the heat sink 13 is large, grease provided between the heat sink 13 and the electric device 11a may flow outside due to a difference between the coefficients of thermal expansion of the heat sink 13 and the electric device 11a, for example, and the thermal connectivity between the heat sink 13 and the electric device 11a may decrease. As a result, the electric device 11a is likely to be heated and the reliability of the electric device 11a may decrease.

On the other hand, in the present embodiment, the controller 29 monitors the detection value related to the power loss of the electric device 11a, controls the electromagnetic valve 26 so that the quantity of the second cooling water flowing from the second pipe 24 into the bypass pipe 25 increases in a case where the detection value is smaller than the first threshold, and controls the electromagnetic valve 26 so that the quantity of the second cooling water flowing from the second pipe 24 into the bypass pipe 25 decreases in a case where the detection value is equal to or larger than the second threshold. According to such a configuration, a temperature variation of the heat sink 13 can be suppressed to the width of $\Delta T'$. In this way, it is possible to decrease a temperature variation of the heat sink 13. When the temperature variation of the heat sink 13 can be decreased, it is possible to improve the reliability of the electric device 11a with increased thermal cycling capacity of the electric device 11a.

In the present embodiment, the cooling device 3 includes the bypass pipe 25 that branches from the second pipe 24 so that at least a portion of the second cooling water flowing through the second pipe 24 returns to the second pipe 24 without passing through the heat exchanger 20. The electromagnetic valve 26 changes the quantity of the second cooling water flowing from the second pipe 24 into the bypass pipe 25. According to such a configuration, in a cooling device without an inverter function (a cooling device that cannot adjust the flow rate), it is possible to decrease a temperature variation of the heat sink 13 and to improve the reliability of the electric device 11a.

In the present embodiment, a value related to the power loss of the electric device 11a is monitored as the detection value. According to such a configuration, it is not necessary to measure the temperature of a cooling water when comparing a threshold and a detection value. Moreover, in a case where control is performed on the basis of the detected water temperature, since change in the water temperature has a time constant, the control response is late. However, since the current value changes instantaneously, a quick control response can be obtained.

Second Embodiment

Next, a second embodiment will be described. The present embodiment is different from the first embodiment in that the temperature of the first cooling water is monitored directly as a detection value. The configuration other than those described below is the same as that of the first embodiment.

Figure 8:
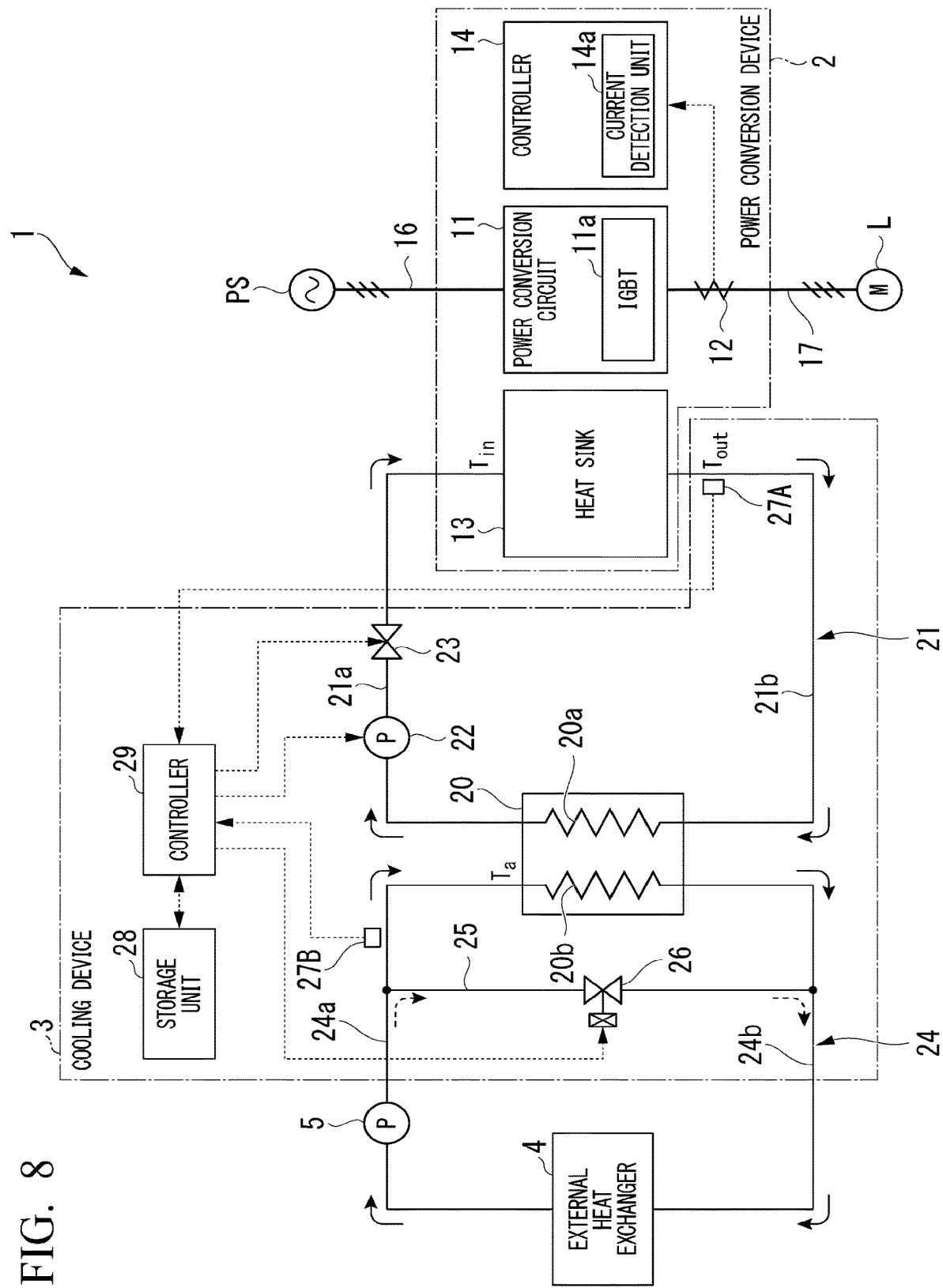
FIG. 8 is a diagram illustrating an example of a drive system of a second embodiment.
Figure 9:
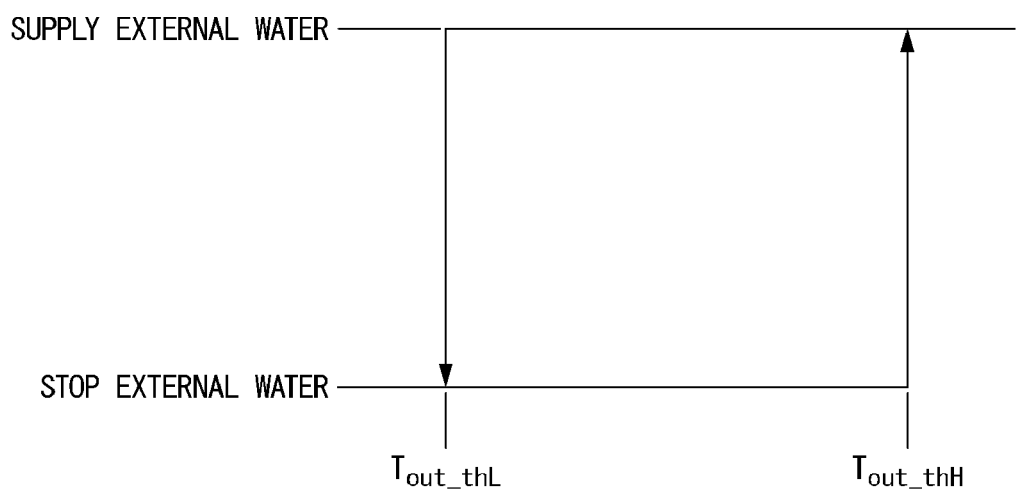
FIG. 9 is a diagram for describing a control mode of the second embodiment.

FIG. 8 is a diagram illustrating an example of a drive system 1 according to the second embodiment. FIG. 9 is a diagram illustrating a control mode of the second embodiment. In the present embodiment, in the first control mode, a first threshold $T_{out\_thL}$ and a second threshold $T_{out\_thH}$ are set as a threshold related to the temperature of the first cooling water instead of the threshold $W_{th}$ related to the power loss (see FIG. 9).

The comparing unit 35 of the controller 29 periodically compares the cooling water outlet temperature $T_{out}$ detected by the first temperature sensor 27A with the first threshold $T_{out\_thL}$ and the second threshold $T_{out\_thH}$, for example. The controller 29 controls the electromagnetic valve 26 so as to be open in a case where the cooling water outlet temperature $T_{out}$ decreases to be smaller than $T_{out\_thL}$ in the closed state of the electromagnetic valve 26. On the other hand, the controller 29 controls the electromagnetic valve 26 so as to be closed in a case where the cooling water outlet temperature $T_{out}$ increases to be $T_{out\_thH}$ or more in the open state of the electromagnetic valve 26.

In the present embodiment, in the second control mode, a first threshold $T_{out\_thL}'$ and a second threshold $T_{out\_thH}'$ are set as a threshold related to the temperature of the first cooling water instead of the threshold $W_{th}'$ related to the power loss. The method of using the first threshold $T_{out\_thL}'$ and the second threshold $T_{out\_thH}'$ is similar to that of the first threshold $T_{out\_thL}$ and the second threshold $T_{out\_thH}$.

With this configuration, it is also possible to suppress a temperature variation of the heat sink 13 and to improve the reliability of the electric device which is a cooling target. The first threshold $T_{out\_thL}$ and the second threshold $T_{out\_thH}$ are different values, for example, but may be the same values. Similarly, the first threshold $T_{out\_thL}'$ and the second threshold $T_{out\_thH}'$ are different values, for example, but may be the same values.

Modification

Next, a modification of the first and second embodiments will be described. For example, when the external water temperature $T_a$ and the quantity Q of the first cooling water are substantially constant, the cooling device 3 may be designed so as to always satisfy the first condition. In this case, the controller 29 may not need to determine whether the first control mode and the second control mode will be used, and the threshold $W_{th}$ (or the first threshold $T_{out\_thL}$ or the second threshold $T_{out\_thH}$) may be always set as a threshold.

Similarly, the cooling device 3 may be designed so as to always satisfy the second condition without satisfying the first condition. In this case, the controller 29 may not need to determine whether the first control mode and the second control mode will be used, and the threshold $W_{th}'$ (or the first threshold $T_{out\_thL}'$ or the second threshold $T_{out\_thH}'$) may be always set as a threshold.

In the embodiments and the modification, all or some parts of the controller 29 are realized by hardware (including circuitry) such as, for example, LSI (Large Scale Integration), ASIC (Application Specific Integrated Circuit), PLD (Programmable Logic Device), or FPGA (Field-Programmable Gate Array). All or some parts of the controller 29 may be a software functional unit realized when a hardware processor such as a CPU (Central Processing Unit) executes a computer program (software) stored in a memory (not illustrated) and may be realized by cooperation of hardware and software functional units.

Several embodiments and modifications have been described. However, the embodiment is not limited to the above example. For example, the electric device 11a attached to the heat sink 13 is not limited to an IGBT module and may be other types of electric devices.

In the above-described embodiments, the cooling device 3 includes the bypass pipe 25 and the electromagnetic valve 26. The cooling device 3 may not have the bypass pipe 25. In this case, the cooling device 3 may include a pump which is provided in the second pipe 24, and of which the rotational speed or the like is variable, and which can change the quantity of the second cooling water flowing through the second pipe 24. In this case, the pump is an example of a "flow changing mechanism".

According to at least one of the embodiments described above, the controller of the cooling device monitors the detection value related to at least one of the power loss of the electric device and the temperature of the first cooling water, controls the flow changing mechanism so that the quantity of the second cooling water flowing from the second pipe into the bypass pipe increases in a case where the detection value is smaller than the first threshold, and controls the flow changing mechanism so that the quantity of the second cooling water flowing from the second pipe into the bypass pipe decreases in a case where the detection value is equal to or larger than the second threshold. According to such a configuration, it is possible to improve the reliability of the electric device which is a cooling target.

While certain embodiments of the present invention have been described, these embodiments have been presented by way of example only, and are not intended to limit the scope of the invention. These embodiments may be embodied in a variety of other forms, and various omissions, substitutions, and changes can be made without departing from the spirit of the invention. These embodiments and modifications thereof fall within the scope and spirit of the inventions and the inventions described in the claims and the equivalents thereof.

REFERENCE SIGNS LIST

1: Drive system
2: Power conversion device
3: Cooling device
4: External heat exchanger (Second heat exchanger)
11: Power conversion circuit
11a: Module (Electric device)
13: Heat sink
20: Heat exchanger (First heat exchanger)
21: First pipe
24: Second pipe 25: Bypass pipe
26: Electromagnetic valve (Flow changing mechanism)
29: Controller

The invention claimed is:
1. A cooling device comprising:
a first heat exchanger configured to exchange heat between a first cooling water and a second cooling water;
a first pipe through which the first cooling water circulates between the first heat exchanger and a heat sink, the heat sink being thermally connected to an electric device;
a second pipe through which the second cooling water circulates between a second heat exchanger and the first heat exchanger;
a bypass pipe that branches from the second pipe so that at least a part of the second cooling water flowing through the second pipe returns to the second pipe without passing through the first heat exchanger;
a flow changing mechanism configured to change a quantity of the second cooling water flowing from the second pipe into the bypass pipe; and
a controller including at least one of circuitry and a hardware processor that executes a program, the controller being configured to monitor a detection value related to at least a power loss of the electric device, configured to control the flow changing mechanism so that the quantity of the second cooling water flowing from the second pipe into the bypass pipe increases in a case where a value related to power loss of the electric device of the detection value is smaller than a first threshold, and configured to control the flow changing mechanism so that the quantity of the second cooling water flowing from the second pipe into the bypass pipe decreases in a case where a value related to power loss of the electric device of the detection value is equal to or larger than a second threshold,
wherein the controller is configured to calculate the power loss based on a current value of an output current of the electric device and a current-loss characteristics of the electric device.

2. The cooling device according to claim 1, wherein
the cooling device is switched by the flow changing mechanism between a first state and a second state in which the quantity of the second cooling water flowing from the second pipe into the bypass pipe is larger than that in the first state, and
in a case where temperature of the first cooling water when it is assumed that the electric device operates with a smallest power loss in the first state is a first reference temperature, and the temperature of the first cooling water when it is assumed that the electric device operates with a smallest power loss in the second state is a second reference temperature,
the first threshold is set to be within a range in which, when it is assumed that the electric device operates in the first state, a difference between the temperature of the first cooling water and the second reference temperature is equal to or smaller than half a difference between the first reference temperature and the second reference temperature.

3. The cooling device according to claim 2, wherein
in a case where a heat exchange efficiency of the first heat exchanger in the first state is $\varepsilon_1$, a heat exchange efficiency of the first heat exchanger in the second state is $\varepsilon_2$, a largest power loss during operation of the electric device is $W_{max}$, a smallest power loss during operation of the electric device is $W_{min}$, and the temperature of the first cooling water when it is assumed that the electric device operates with a largest power loss in the first state is a third reference temperature,
the controller determines whether a first condition represented by the following equation is satisfied or not,

[Math. 1]

$$\frac{\varepsilon_1}{\varepsilon_2} \leq \sqrt{\frac{W_{max}}{W_{min}}} \quad (1)$$

in a case where it is determined that the first condition is satisfied, the controller controls the cooling device in a first control mode, and
in the first control mode,
the first threshold is set to be within a range from a value at which the temperature of the first cooling water when it is assumed that the electric device operates in the first state is the second reference temperature, to a value at which the temperature of the first cooling water when it is assumed that the electric device operates in the second state is the third reference temperature.

4. The cooling device according to claim 3, wherein
the controller controls the cooling device in a second control mode in a case where it is determined that the first condition is not satisfied, and
in the second control mode,
in a case where a difference between the temperature of the first cooling water and the second reference temperature when it is assumed that the electric device operates in the first state is a first difference and a difference between the temperature of the first cooling water and the third reference temperature when it is assumed that the electric device operates in the second state is a second difference,
the first threshold is set to be within a range from a value at which the first difference and the second difference are equal to each other, to a value at which the temperature of the first cooling water when it is assumed that the electric device operates in the second state is the third reference temperature.

5. The cooling device according to claim 4, wherein
in a case where the flow changing mechanism is controlled in the second control mode, the controller determines whether a second condition represented by the following equation is satisfied or not, and

[Math. 2]

$$\frac{\varepsilon_1}{\varepsilon_2} < \sqrt{\frac{2W_{max}}{W_{min}} - 1} \quad (2)$$

in a case where the second condition is not satisfied, the controller does not perform switching from the first state to the second state.

6. The cooling device according to claim 2, wherein
in a case where a heat exchange efficiency of the first heat exchanger in the first state is $\varepsilon_1$, a heat exchange efficiency of the first heat exchanger in the second state is $\varepsilon_2$, a largest power loss during operation of the electric device is $W_{max}$, a smallest power loss during operation of the electric device is $W_{min}$, and the temperature of the first cooling water when it is assumed that the electric device operates with a largest power loss in the first state is a third reference temperature,
the cooling device is configured to satisfy a condition represented by the following equation, and

[Math. 3]

$$\frac{\varepsilon_1}{\varepsilon_2} \leq \sqrt{\frac{W_{max}}{W_{min}}} \quad (3)$$

the first threshold is set to be within a range from a value at which the temperature of the first cooling water when it is assumed that the electric device operates in the first state is the second reference temperature, to a value at which the temperature of the first cooling water when it is assumed that the electric device operates in the second state is the third reference temperature.

7. The cooling device according to claim 2, wherein in a case where a heat exchange efficiency of the first heat exchanger in the first state is $\varepsilon_1$, a heat exchange efficiency of the first heat exchanger in the second state is $\varepsilon_2$, a largest power loss during operation of the electric device is $W_{max}$, a smallest power loss during operation of the electric device is $W_{min}$, the temperature of the first cooling water when it is assumed that the electric device operates with a largest power loss in the first state is a third reference temperature, a difference between the temperature of the first cooling water and the second reference temperature when it is assumed that the electric device operates in the first state is a first difference and a difference between the temperature of the first cooling water and the third reference temperature when it is assumed that the electric device operates in the second state is a second difference,
the cooling device is configured to satisfy conditions represented by the following equations, and

[Math. 4]

$$\frac{\varepsilon_1}{\varepsilon_2} > \sqrt{\frac{W_{max}}{W_{min}}} \quad (4)$$

[Math. 5]

$$\frac{\varepsilon_1}{\varepsilon_2} < \sqrt{\frac{2W_{max}}{W_{min}} - 1} \quad (5)$$

the first threshold is set to be within a range from a value at which the first difference and the second difference are equal to each other, to a value at which the temperature of the first cooling water when it is assumed that the electric device operates in the second state is the third reference temperature.

8. A cooling device comprising:
a first heat exchanger configured to exchange heat between a first cooling water and a second cooling water;
a first pipe through which the first cooling water circulates between the first heat exchanger and a heat sink, the heat sink being thermally connected to an electric device;
a second pipe through which the second cooling water circulates between a second heat exchanger and the first heat exchanger;
a flow changing mechanism configured to change a quantity of the second cooling water flowing from the second pipe into the first heat exchanger; and
a controller including at least one of circuitry and a hardware processor that executes a program, the controller being configured to monitor a detection value related to at least a power loss of the electric device, configured to control the flow changing mechanism so that the quantity of the second cooling water flowing from the second pipe into the first heat exchanger decreases in a case where a value related to power loss of the electric device of the detection value is smaller than a first threshold, and configured to control the flow changing mechanism so that the quantity of the second cooling water flowing from the second pipe into the first heat exchanger increases in a case where a value related to power loss of the electric device of the detection value is equal to or larger than a second threshold,
wherein the controller is configured to calculate the power loss based on a current value of an output current of the electric device and a current-loss characteristics of the electric device.

9. A cooling method for cooling an electric device using a cooling device, the cooling device including:
a first heat exchanger configured to exchange heat between a first cooling water and a second cooling water;
a first pipe through which the first cooling water circulates between the first heat exchanger and a heat sink, the heat sink being thermally connected to an electric device;
a second pipe through which the second cooling water circulates between a second heat exchanger and the first heat exchanger;
a bypass pipe that branches from the second pipe so that at least a part of the second cooling water flowing through the second pipe returns to the second pipe without passing through the first heat exchanger; and
a flow changing mechanism configured to change a quantity of the second cooling water flowing from the second pipe into the bypass pipe,
the cooling method being executed by at least one of circuitry and a hardware processor that executes a program, the method further comprising:
calculating a power loss based on a current value of an output current of the electric device and a current-loss characteristics of the electric device;
monitoring a detection value related to at least the power loss of the electric device;
controlling the flow changing mechanism so that the quantity of the second cooling water flowing from the second pipe into the bypass pipe increases in a case where a value related to the power loss of the electric device of the detection value is smaller than a first threshold; and
controlling the flow changing mechanism so that the quantity of the second cooling water flowing from the second pipe into the bypass pipe decreases in a case where a value related to the power loss of the electric device of the detection value is equal to or larger than a second threshold.

* * * * *